(12) United States Patent
Taki

(10) Patent No.: US 11,336,284 B2
(45) Date of Patent: *May 17, 2022

(54) ANALOG SWITCH MULTIPLEXER SYSTEMS AND RELATED METHODS

(71) Applicant: SEMICONDUCTOR COMPONENTS INDUSTRIES, LLC, Phoenix, AZ (US)

(72) Inventor: Konosuke Taki, Sendai (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/165,061

(22) Filed: Feb. 2, 2021

(65) Prior Publication Data
US 2021/0159901 A1 May 27, 2021

Related U.S. Application Data

(63) Continuation of application No. 16/682,373, filed on Nov. 13, 2019, now Pat. No. 10,924,116.

(60) Provisional application No. 62/912,758, filed on Oct. 9, 2019.

(51) Int. Cl.
*H03K 19/0944* (2006.01)
*H03K 17/06* (2006.01)
*H03K 19/173* (2006.01)
*H03K 19/17736* (2020.01)

(52) U.S. Cl.
CPC ....... *H03K 19/0944* (2013.01); *H03K 17/063* (2013.01); *H03K 19/1737* (2013.01); *H03K 19/17736* (2013.01)

(58) Field of Classification Search
None
See application file for complete search history.

(56) References Cited

U.S. PATENT DOCUMENTS

| | | | |
|---|---|---|---|
| 10,097,178 B1 | 10/2018 | Ou et al. | |
| 2005/0139931 A1* | 6/2005 | Arai | H01L 27/0928 257/370 |
| 2006/0267478 A1 | 11/2006 | Lai et al. | |
| 2009/0033155 A1 | 2/2009 | Kanno et al. | |
| 2016/0173079 A1 | 6/2016 | Fiedorow et al. | |
| 2018/0069530 A1* | 3/2018 | Ranta | H03J 5/24 |

* cited by examiner

*Primary Examiner* — Jany Richardson
(74) *Attorney, Agent, or Firm* — Adam R. Stephenson, Ltd.

(57) ABSTRACT

A motor controller system that includes an analog switch multiplexer system is disclosed. Specific implementations include a plurality of field effect transistors (FETs) that may be configured to be operatively coupled with one or more phases of a motor. Each of the plurality of FETs may include a gate, an analog switch multiplexer coupled with each of the gates of the plurality of FETs and with an analog output, and a digital control block coupled with the analog switch multiplexer that may be configured to send a multiplexer select control signal to the analog switch multiplexer in response to receiving a serial peripheral interface signal.

20 Claims, 4 Drawing Sheets

ANALOG SWITCH MULTIPLEXER SYSTEMS AND RELATED METHODS

CROSS REFERENCE TO RELATED APPLICATIONS

This application claims the benefit of the filing date of U.S. Provisional Patent Application 62/912,758, entitled "ANALOG SWITCH MULTIPLEXER SYSTEMS AND RELATED METHODS" to Konosuke Taki, which was filed on Oct. 9, 2019, the disclosure of which is hereby incorporated entirely herein by reference;

This application is also a continuation application of U.S. patent application Ser. No. 16/682,373, entitled, "Analog Switch Multiplexer Systems and Related Methods," to Konosuke Taki, which was filed on Nov. 13, 2019, the disclosure of which is hereby incorporated entirely herein by reference.

BACKGROUND

1. Technical Field

Aspects of this document relate generally to switch circuits.

2. Background

Analog switch circuits operate by switching or routing signals based on a digital control signal. Analog switches act as a solid-state relay which, when ON, can conduct both analog and digital signals.

SUMMARY

Implementations of a motor controller system may include: a plurality of field effect transistors (FETs) that may be configured to be operatively couple with one or more phases of a motor. Each of the plurality of FETs may include a gate, an analog switch multiplexer coupled with each of the gates of the plurality of FETs and with an analog output, and a digital control block coupled with the analog switch multiplexer that may be configured to send a multiplexer select control signal to the analog switch multiplexer in response to receiving a serial peripheral interface signal.

Implementations of a motor controller system may include one, all, or any of the following:

A pin that may be included that is configured to be operatively coupled with a serial peripheral interface.

An analog out pin may be included that is operatively coupled to the analog switch multiplexer.

A voltage at the analog out pin may be equal to a gate voltage of one FET of the plurality of FETs.

A voltage at the analog out pin may be substantially equal to the drain breakdown voltage of an NMOS transistor or a PMOS transistor comprised in the analog switch multiplexer.

Implementations of an analog switch multiplexer system may include: a first PMOS transistor coupled with a first diode, the first diode directed inside; a second PMOS transistor coupled with a second diode, the second PMOS transistor and the second diode coupled in series with the first PMOS transistor and the first diode, the second diode directed inside, a first NMOS transistor coupled with a third diode, the third diode directed outside; and a second NMOS transistor coupled with a fourth diode, the second NMOS transistor and the fourth diode coupled in series with the first NMOS transistor and the third diode, the fourth diode directed inside. In various implementations the first PMOS and second PMOS transistor may be coupled in parallel with the first NMOS transistor and the second NMOS transistor.

Implementations of an analog switch multiplexer system may include one, all, or any of the following:

A first pin may be coupled to the first PMOS transistor and to the second NMOS transistor.

A first resistor may be coupled between the first pin and the first PMOS transistor.

A second pin may be coupled to the second PMOS transistor and to the second NMOS transistor.

A second resistor may be coupled between the second pin and the second PMOS transistor.

A third NMOS transistor may include a gate coupled with a digital control block and with a gate of the first NMOS transistor and a gate of the second NMOS transistor.

A first current source may be coupled with a fifth diode coupled with the third NMOS transistor, the first current source coupled with a resistor coupled with a fourth NMOS transistor coupled with a sixth diode coupled to a gate control voltage input.

A second current source may be coupled in parallel with a gate of the fourth NMOS transistor and coupled with the resistor.

The gate of the fourth NMOS transistor may be coupled between the first PMOS transistor, the second PMOS transistor, and the first diode and the second diode.

Implementations of a method of operating an analog switch multiplexer circuit may include: using a digital control block, applying an ON voltage to a gate of an NMOS transistor coupled with a diode and a current source. In response to receiving the ON voltage at two NMOS transistors coupled in parallel with the ON voltage, the method may include turning on the two NMOS transistors, the two NMOS transistors coupled in parallel with a first PMOS transistor and with a second PMOS transistor. The method may also include turning on the first PMOS transistor and the second PMOS transistor. While the first PMOS transistor and the second PMOS transistor are on, the method may include transmitting an analog gate voltage of a field effect transistor (FET) from a first pin to a second pin through a channel of the first PMOS transistor and a channel of the second PMOS transistor. The analog gate voltage may be at the operating voltage of the FET and greater than 3.6 volts.

Implementations of a method of operating an analog switch multiplexer circuit may include one, all, or any of the following:

The method may include using a digital control block, applying an OFF voltage to a gate of an NMOS transistor coupled with a diode and a current source.

The method may include applying an OFF voltage may also include turning off a current flow from the current source, and closing the NMOS transistor and turning off each gate of the PMOS transistors.

A gate control voltage may flow to ground through a fourth NMOS transistor, a resistor, and a first current source.

The method may include transmitting the analog gate voltage to one of a first pin or a second pin in response to applying a voltage to one of the second pin or the first pin, respectively.

The method may include using an analog switch multiplexer, sequentially transmitting the analog gate voltage for each FET in response to receiving sequential signals from the digital control block.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended analog switch systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such analog switch systems and implementing components and methods, consistent with the intended operation and methods.

Figure 1:
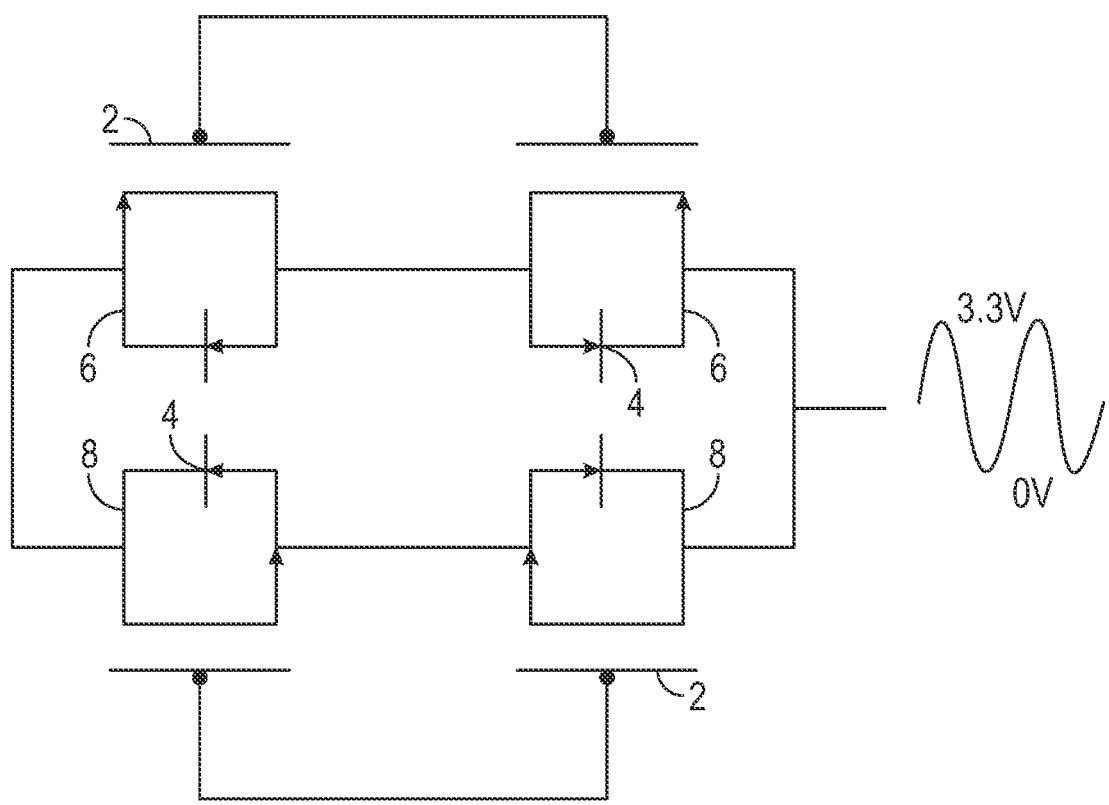
FIG. 1 illustrates an implementation of an analog switch system.

Referring to FIG. 1, an implementation of an analog switch system is illustrated. As illustrated, two PMOS transistors 6 are coupled in parallel with two NMOS transistors 8. As illustrated, a first PMOS transistor is coupled in series with a second PMOS transistor, and a first NMOS transistor is coupled in series with a second NMOS transistor. As illustrated, the PMOS transistors 6 and the NMOS transistors 8 are each individually coupled with diodes 4. In this analog switch system, each diode 4 is directed outside, or in other words, the diode 4 coupled to the first PMOS transistor is directed/biased/oriented in the opposite direction from the diode 4 coupled to the second PMOS transistor. As illustrated, the transistors each include a gates 2 which for the PMOS transistors 6 are electrically coupled together and for the NMOS transistors 8 are electrically coupled together. Because the gates 2 are electrically conducted together, an analog input signal illustrated as the analog signal ranging from 0 V to 3.3 V, when applied to the input, causes the analog switching system to switch only as long as the input signal does not exceed the gate breakdown voltage (in this case 3.3 V). This is because the outwardly directed diodes 4 cause all of the electrical current to flow through the channel of the NMOS or PMOS transistors (depending on which state the analog switching circuit is in and the only control of the electrical current flow is via the gate voltage. If the gate voltage is exceeded, then damage to the NMOS and/or PMOS transistors will result, causing the analog switching system to be rendered inoperable.

Because of this behavior of the switching system, for analog switching systems like those illustrated in FIG. 1, the analog input signal to the system cannot exceed the gate breakdown voltage. Because gate breakdown voltages for NMOS and PMOS transistors often are no greater than 3 V–3.3 V, when analog switch designs like those illustrated in FIG. 1 are implemented for analog signals exceeding 3.3 V, various voltage regulation circuitry must be employed to step the voltage down to not exceed the gate breakdown voltage. This generally adds complexity to the resulting circuitry making it harder to implement analog switching system designs like those illustrated in FIG. 1 in higher voltage analog circuit applications.

Figure 2:
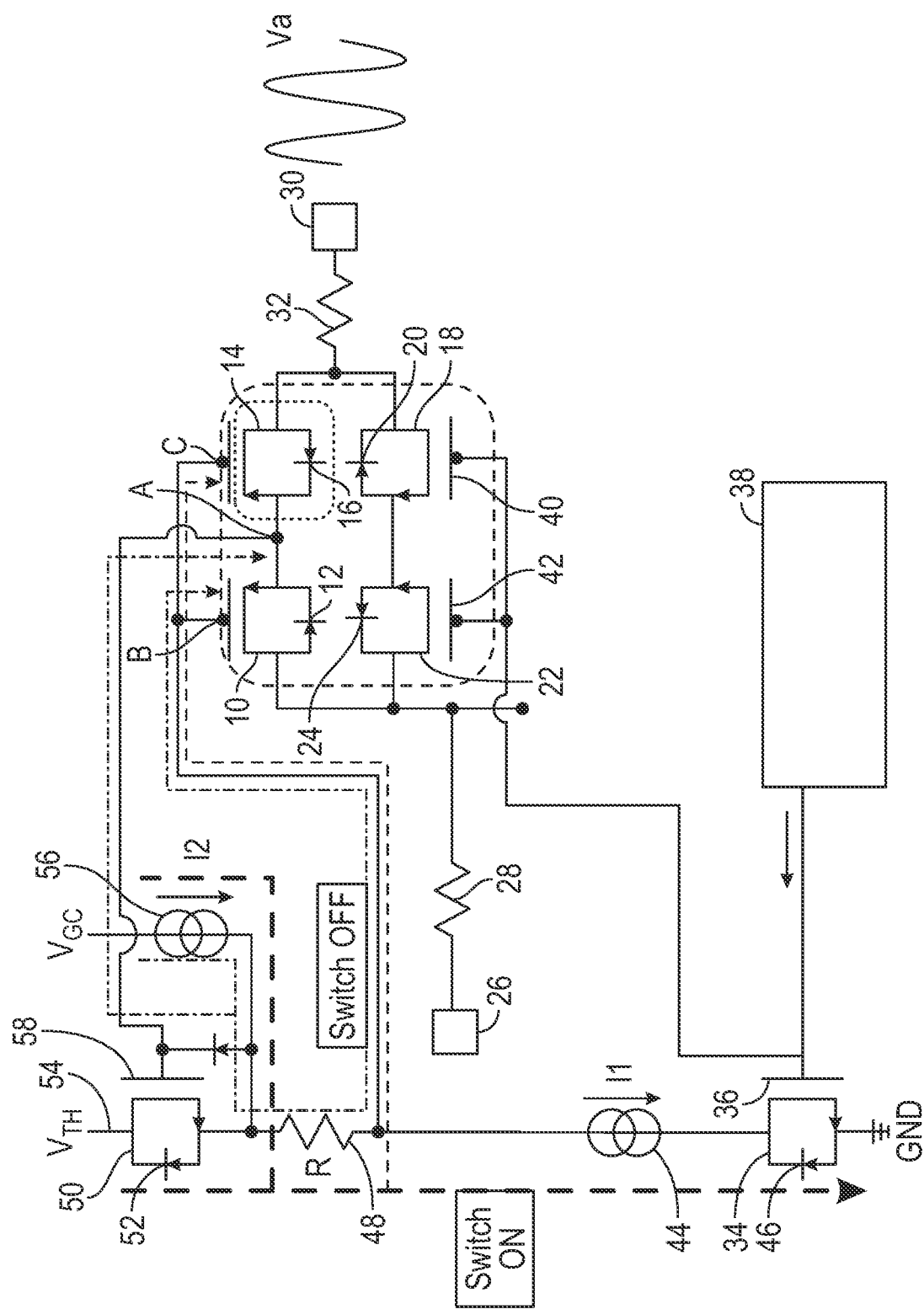
FIG. 2 illustrates an implementation of an analog switch multiplexer system.

Referring to FIG. 2, another implementation of an analog switch multiplexer system is illustrated. As illustrated, a first PMOS transistor 10 is coupled with a first diode 12 which is directed inside. As illustrated, a second PMOS transistor 14 is coupled with a second diode 16 which is also directed inside, toward diode 12. In various implementations, the second PMOS transistor 14 and the second diode 16 are coupled in series with the first PMOS transistor 10 and the first diode 12. As illustrated, a first NMOS transistor 18 is coupled with a third diode 20 which is directed outside. As illustrated, a second NMOS transistor 22 is coupled with a fourth diode 24 which is also directed outside, or away from the third diode 20. As illustrated, the second NMOS transistor 22 and the fourth diode 24 are coupled in series with the first NMOS transistor 18 and the third diode 20. The directing of the first diode 12 and the second diode 16 inside contrasts with the arrangement in the analog switching system implementation FIG. 1 where the corresponding diodes are directed inwards. As illustrated, the first PMOS transistor 10 and the second PMOS transistor 14 are coupled in parallel with the first NMOS transistor 18 and the second NMOS transistor 22.

Still referring to FIG. 2, a first pin 26 coupled to the first PMOS transistor 10 and to the second NMOS transistor 22 which functions as an analog signal input or output to the transistors. As illustrated, a first resistor 28 is coupled between the first pin 26 and the first PMOS transistor 10 which functions to protect these devices from ESD stress. As illustrated, a second pin 30 and a corresponding second resistor 32 is coupled to the second PMOS transistor 14 and to the second NMOS transistor 22 which also functions as an analog signal input or output for the transistors. In various implementations, the second PMOS transistor 14 includes gate C and the first PMOS transistor 10 includes gate B.

As illustrated, a third NMOS transistor 34 includes a gate 36 coupled with a digital control block 38 and with a gate 40 of the first NMOS transistor 18 and a gate 42 of the second NMOS transistor 22. As illustrated, a first current source 44 is coupled with a fifth diode 46 coupled with the third NMOS transistor 34. As illustrated, the first current source 44 is also coupled with a resistor (R) 48. Resistor 48 is coupled in series with a fourth NMOS transistor 50 that is coupled with a sixth diode 52 that are coupled in parallel with a gate control voltage input 54. As illustrated, a second current source (I2) 56 is connected with the diode to a gate 58 of the fourth NMOS transistor 50 and is also coupled with the resistor 48. In various implementations, the gate 58 of the fourth NMOS transistor 50 is coupled to node A located between the first PMOS transistor 10, the second PMOS transistor 14, and the first diode 12 and the second diode 16.

During operation of the analog switching system, an analog input/feed signal with a voltage $V_a$ is applied to either the first pin 26 or the second pin 30 and a corresponding switched output (on or off) is provided by the analog switching system at the second pin 30 or the first pin 26, respectively. At this point the voltage at node A is the difference between $V_a$–$V_F$ (analog input voltage–the forward voltage). The forward voltage is applied using diode 12. When the control system desires to activate the switch and transfer the analog input/feed signal from the first pin 26 to the second pin 30 (or vice versa), digital control block 38 is used to apply an ON voltage to the gate 36 of the third NMOS transistor 34, causing current to flow through the third NMOS transistor 36 from current source I1 (44) to ground. At the same time, since node A is connected to the gate of the NMOS transistor source follower, the voltage at node A—Vth−R*I1 is applied to the gate of the first PMOS transistor 10 and the second PMOS transistor 14, turning the PMOS transistor on. Said differently, the first PMOS transistor's gate voltage in response to the analog input signal is generated using the forward diode 12, the NMOS transistor source follower, and the voltage drop caused by the constant current source I1 and resistor R. In the foregoing equation Vth is the voltage associated with fourth NMOS transistor 50. In such implementations, while the first PMOS transistor 10 and the second PMOS transistor 14 are on, current from a first pin 26 to a second pin 30 (or vice versa) is transmitted through the channel of the first PMOS transistor 10 and the channel of the second PMOS transistor 14.

Because gates 40 and 42 are coupled in parallel with gate 36, the ON voltage from the digital control block 38 is simultaneously applied to the gates 40 and 42, also switching the two NMOS transistors 18 and 22 on, thus allowing current to flow from pin 26 to pin 30 or vice versa through the channels of NMOS transistors 18 and 22 as directed by outwardly directed fourth diode 24 and third diode 20. This turns the switching system ON, allowing the analog input signal to pass directly through the transistor channels (source to drain) rather than being applied to the gates of the transistors. This movement of the signal through the channels allows the voltage of the analog input signal to be as high as the drain breakdown voltage of the NMOS transistors and PMOS transistors themselves rather than just the gate breakdown voltage. As the drain breakdown voltage of the NMOS transistors and PMOS transistors can be much higher than 3.3 V (40 V or more), the analog switching system no longer needs any voltage step down circuitry to prevent damage to the transistors for a wide variety of voltages up to the drain breakdown voltage.

When the analog switching system is to be switched off, to stop flow of analog signal from the first pin 26 to the second pin 30 (or vice versa), an OFF voltage may be applied to gate 36 of the third NMOS transistor 34, using the digital control block 38. In such implementations, applying the OFF voltage happens as the digital control block 38 drops the voltage applied at gate 36 to low of third NMOS transistors 34. This simultaneously changes the gate voltage applied to gates 42 and 40, thus turning off the second NMOS transistor 22 and the first NMOS transistor 20. The gate voltage at B and C of the first PMOS transistor 10 and second PMOS transistor 14 is then forced to $V_{GC}-R*I2$. This simultaneously forces the sources of the first PMOS transistor 10 and second PMOS transistor 14 to $V_{GC}-V_F$. Since the voltage R*I2 is less than $V_F$, the PMOS transistors then turn off and prevent any further analog signal flow.

This ability to switch the PMOS and NMOS transistors on to pass the analog signal from first pin to the second pin and to the second pin to the first pin in response to the signal from the digital control block 38 allows the analog switching system to function as an analog switch multiplexer. Where the analog switching system is coupled to two or more field effect transistors (FET), the system can be used to sequentially transmit the analog gate voltage for each field effect transistor (FET) in response to receiving sequential signals from the digital control block 38.

Figure 3:
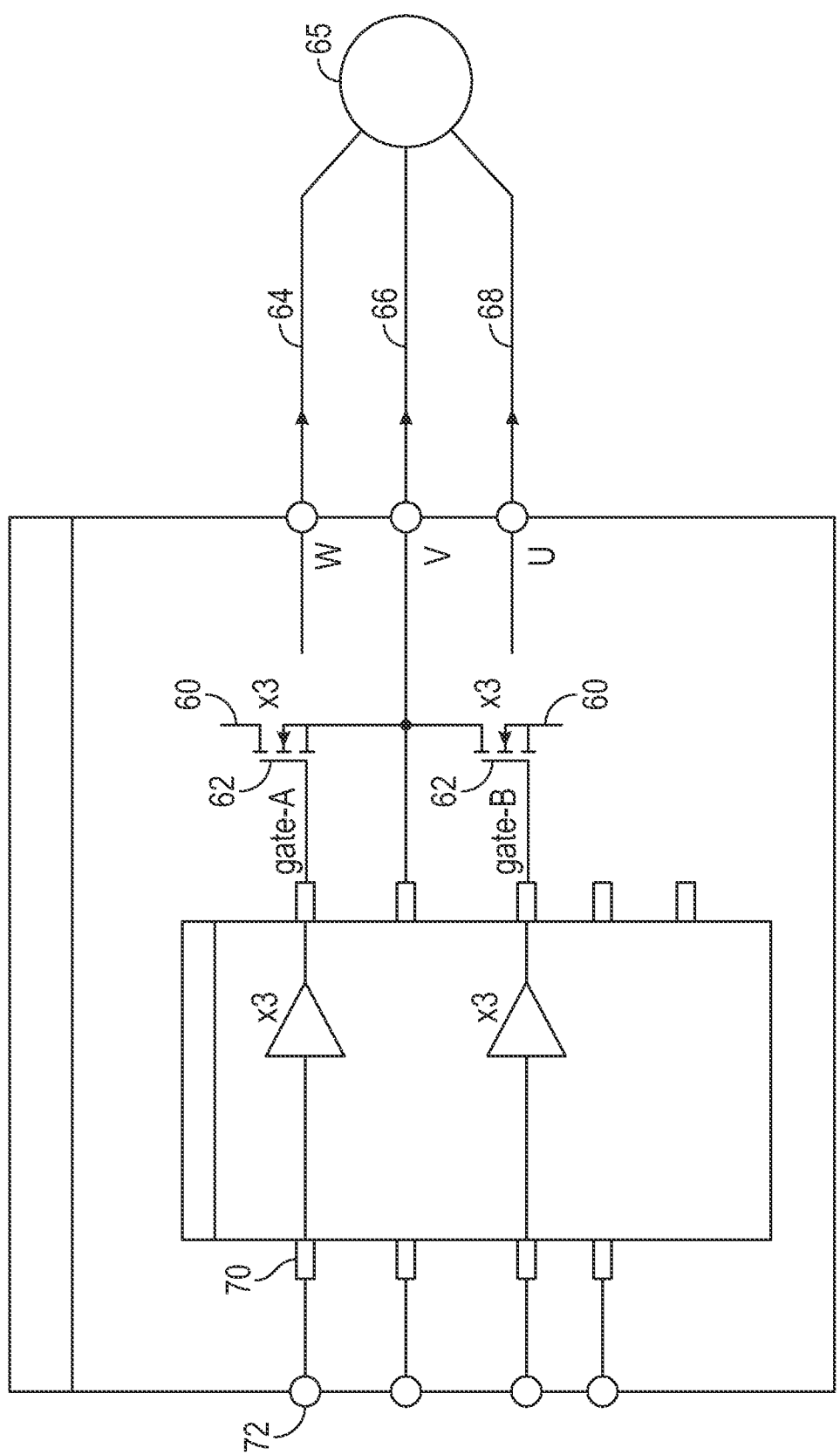
FIG. 3 illustrates an implementation of a motor controller system.

Referring to FIG. 3, an implementation of a motor controller system is illustrated. As illustrated, a plurality of field effect transistors (FETs) 60 (each represented in groups of 3) are coupled with one or more phases 64, 66, and 68 of a motor 65. In various implementations, the phases include a W phase 64, a V phase 66, and a U phase 68. As illustrated, each of the plurality of FETs 60 includes a gate 62. As illustrated, the system also includes pads or outputs 70 from the integrated circuit (IC) and corresponding board outputs or pins 72. In this system, there is no ability for the controller to be able to transmit what the voltage at the gates 62 is during operation of the system as there is no separate path for the gate voltages to be transmitted via the controller out of the semiconductor package.

Figure 4:
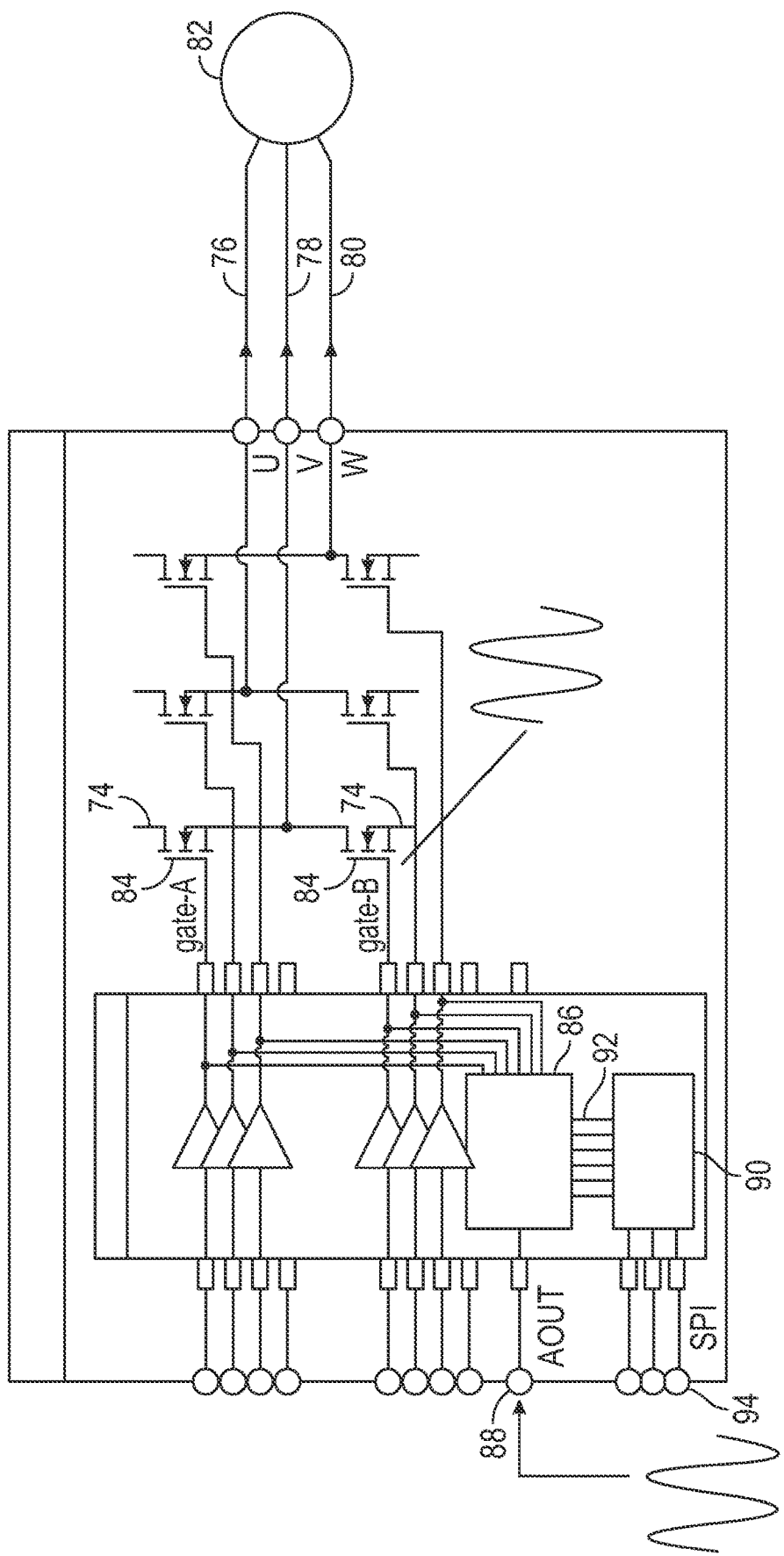
FIG. 4 illustrates an implementation of a motor controller system that includes an analog switch multiplexer system implementation.

Referring to FIG. 4, an implementation of a motor controller system that includes an implementation of an analog switch multiplexer system like that disclosed herein is illustrated. The use of the analog switch multiplexer system allows transmission of the FET gate voltages during operation of the system using a single analog out pin AOUT. As illustrated, a plurality of field effect transistors (FETs) 74 (six in all) are each coupled with one or more phases 76, 78, and 80 of a motor 82. In various implementations, the phases may include a W phase 80, a V phase 78, and a U phase 76. As illustrated, each of the plurality of FETs 74 includes a gate 84. As illustrated, the analog switch multiplexer system 86 is coupled with each of the gates 84 of the plurality of FETs 74 and with a analog output AOUT 88. As illustrated, a digital control block 90 is coupled with the analog switch multiplexer 86. In various implementations, the digital control block 90 is configured to send one or more multiplexer select control signals 92 to the analog switch multiplexer 86 in response to receiving a signal from a serial peripheral interface 94 (SPI). The signal from the SPI is designed to either cause the digital control block 90 to send sequential multiplexer control signals to cycle the output from AOUT through each gate voltage of the plurality of FETs 60 or may, in particular implementations, cause the digital control block 90 to send a specific multiplexer control signal to transmit a specific gate voltage from the plurality of FETs 60 to the AOUT pin. In various implementations, at least the analog switch multiplexer and the digital control block are contained within a motor controller or motor driver.

Still referring to FIG. 4, a pin or pad may be configured to be operatively coupled with the serial peripheral interface 94, in various implementations. In various other implementations, the analog output 88, or analog out pin or pad, may be operatively coupled to the analog switch multiplexer 86. In such implementations, a voltage at the analog out pin 88 is equal to a gate voltage of one FET 74 when the analog switch multiplexer 86 is on and transmitting the analog gate voltage of the FET to the analog out. Where the analog gate voltage is higher than 3.3 V, the system can be designed to have the voltage at the analog out pin 88 is substantially equal to or less than the drain breakdown voltage of an NMOS transistor or a PMOS transistor included within in the analog switch multiplexer 86.

The solid-state analog switches and multiplexers disclosed herein may be used, by non-limiting example, in a wide variety of applications including multi-channel data acquisition systems, process control, instrumentation, video systems, and any other system that requires switching between various analog control signals of varying voltages. In various implementations, the analog switching system is controlled by the N-channel (NMOS) device being turned ON for positive gate-to-source voltages and OFF for negative gate-to-source voltages, while the P-channel device (PMOS) is switched by the complementary signal, so the PMOS devices are correspondingly turned ON at the same time as the N-channel devices. In particular implementations, the analog switching system is turned on and off by driving the gates to opposite supply voltage rails.

Whenever an analog switch input voltage exceeds the supply voltage, the internal ESD protection diodes become forward-biased, allowing large currents to flow, even if the supply voltage is turned off which may cause voltage ratings to be exceeded. The disclosed analog switching system and methods allow for the analog switch input voltage to not exceed the drain breakdown voltage, which may prevent this damage from occurring to the system. In various system implementations, the analog switching system may be implemented in a multi-chip package like an integrated power module (IPM). When included in an IPM, testing can be conducted even if the AOUT pin is not an actual output of the actual package (via signal routing internal to the package to another pin output). In various IPM implementations where the FETs are used as drivers for a motor, the analog switching system may also be used to measure the leakage current of each FET by being coupled with the drain side of each FET rather than or in addition to the gates of the FETs.

The system components disclosed herein may be made of various materials such as silicon, silicon dioxide, tantalum, palladium, semiconductor materials, metals, plastics, alloys, composites, and the like.

In places where the description above refers to particular implementations of analog switching systems and implementing components, sub-components, methods and sub-methods, it should be readily apparent that a number of modifications may be made without departing from the spirit thereof and that these implementations, implementing components, sub-components, methods and sub-methods may be applied to other analog switching systems.

What is claimed is:

1. An analog switch system, comprising:
    a first PMOS transistor coupled with a first diode;
    a second PMOS transistor coupled with a second diode, the second PMOS transistor and the second diode coupled with the first PMOS transistor and the first diode;
    a first NMOS transistor coupled with a third diode; and
    a second NMOS transistor coupled with a fourth diode, the second NMOS transistor and the fourth diode coupled with the first NMOS transistor and the third diode;
    wherein the first PMOS and second PMOS transistor are coupled with the first NMOS transistor and the second NMOS transistor; and
    wherein the system is configured to operate at a voltage up to a drain breakdown voltage of one of the first PMOS transistor, the second PMOS transistor, the first NMOS transistor, or the second NMOS transistor.

2. The system of claim 1, further comprising a second pin coupled to the second PMOS transistor and to the second NMOS transistor.

3. The system of claim 1, further comprising a third NMOS transistor comprising a gate coupled with a digital control block and with a gate of the first NMOS transistor and a gate of the second NMOS transistor.

4. The system of claim 1, further comprising a first current source coupled with a fifth diode coupled with a third NMOS transistor, the first current source coupled with a resistor coupled with a fourth NMOS transistor coupled with a sixth diode coupled to a gate control voltage input.

5. The system of claim 4, further comprising a second current source coupled in parallel with a gate of the fourth NMOS transistor and coupled with the resistor.

6. The system of claim 5, wherein the gate of the fourth NMOS transistor is coupled between the first PMOS transistor, the second PMOS transistor, and the first diode and the second diode.

7. An analog switch system, comprising:
    a first PMOS transistor and a second PMOS transistor coupled with a first diode and with a second diode, respectively, the first diode directed inside and the second diode directed inside; and
    a first NMOS transistor and a second NMOS transistor coupled with a third diode and with a fourth diode, respectively, the third diode directed outside and the fourth diode directed outside;
    wherein the first PMOS transistor and second PMOS transistor are coupled in parallel with the first NMOS transistor and the second NMOS transistor.

8. The system of claim 7, further comprising a first pin coupled to the first PMOS transistor and to the second NMOS transistor.

9. The system of claim 7, wherein the second PMOS transistor and the second diode is coupled in series with the first PMOS transistor and the first diode.

10. The system of claim 7, further comprising a second pin coupled to the second PMOS transistor and to the second NMOS transistor.

11. The system of claim 7, wherein the second NMOS transistor and the fourth diode are coupled in series with the first NMOS transistor and the third diode.

12. The system of claim 7, further comprising a third NMOS transistor comprising a gate coupled with a digital control block and with a gate of the first NMOS transistor and a gate of the second NMOS transistor.

13. The system of claim 7, further comprising a first current source coupled with a fifth diode coupled with a third NMOS transistor, the first current source coupled with a resistor coupled with a fourth NMOS transistor coupled with a sixth diode coupled to a gate control voltage input.

14. The system of claim 13, further comprising a second current source coupled in parallel with a gate of the fourth NMOS transistor and coupled with the resistor.

15. The system of claim 14, wherein the gate of the fourth NMOS transistor is coupled between the first PMOS transistor, the second PMOS transistor, and the first diode and the second diode.

16. A method of operating an analog switch multiplexer circuit, the method comprising:
    using a digital control block, applying an ON voltage to a gate of an NMOS transistor coupled with a diode and a current source;
    in response to receiving the ON voltage at two NMOS transistors coupled in parallel with the ON voltage, turning on the two NMOS transistors, the two NMOS transistors coupled in parallel with a first PMOS transistor and with a second PMOS transistor;
    turning on the first PMOS transistor and the second PMOS transistor; and
    while the first PMOS transistor and the second PMOS transistor are on, transmitting an analog gate voltage of a field effect transistor (FET) from a first pin to a second pin through a channel of the first PMOS transistor and a channel of the second PMOS transistor;

wherein the analog gate voltage is a voltage up to a drain breakdown voltage of one of the first PMOS transistor, the second PMOS transistor, the first NMOS transistor, or the second NMOS transistor.

17. The method of claim 16, further comprising using the digital control block, applying an OFF voltage to the gate of the NMOS transistor coupled with the diode and the current source.

18. The method of claim 17, wherein applying an OFF voltage further comprises:
   turning off a current flow from the current source; and
   closing the NMOS transistor and turning off each gate of the PMOS transistors.

19. The method of claim 16, wherein a gate control voltage flows to ground through a fourth NMOS transistor, a resistor, and a first current source.

20. The method of claim 16, further comprising transmitting the analog gate voltage to one of the first pin or the second pin in response to applying a voltage to one of the second pin or the first pin, respectively.

\* \* \* \* \*